US007247566B2

(12) United States Patent
Carter et al.

(10) Patent No.: US 7,247,566 B2
(45) Date of Patent: Jul. 24, 2007

(54) CMP METHOD FOR COPPER, TUNGSTEN, TITANIUM, POLYSILICON, AND OTHER SUBSTRATES USING ORGANOSULFONIC ACIDS AS OXIDIZERS

(75) Inventors: Melvin K. Carter, Los Gatos, CA (US); Robert J. Small, Dublin, CA (US); Xiaowei Cass Shang, Sunnyvale, CA (US); Donald W. Frey, Pleasanton, CA (US)

(73) Assignee: Dupont Air Products Nanomaterials LLC, Wilmington, DE (US)

( * ) Notice: Subject to any disclaimer, the term of this patent is extended or adjusted under 35 U.S.C. 154(b) by 178 days.

(21) Appl. No.: 10/690,623

(22) Filed: Oct. 23, 2003

(65) Prior Publication Data
US 2005/0090109 A1    Apr. 28, 2005

(51) Int. Cl.
*H01L 21/302* (2006.01)
(52) U.S. Cl. ............... 438/692; 438/691; 438/693; 252/79.1; 134/1.2
(58) Field of Classification Search ............... 438/691, 438/692, 693; 252/79.1, 79.2; 134/1.2, 134/1.3
See application file for complete search history.

(56) References Cited
U.S. PATENT DOCUMENTS

| 6,117,784 | A | 9/2000 | Uzoh |
| 6,455,428 | B1 * | 9/2002 | Tseng ......................... 438/689 |
| 6,527,622 | B1 | 3/2003 | Brusic et al. |
| 6,602,112 | B2 * | 8/2003 | Tran et al. ..................... 451/36 |
| 6,740,589 | B2 | 5/2004 | Shimazu et al. |
| 6,750,128 | B2 | 6/2004 | Kondo et al. |
| 6,786,944 | B2 | 9/2004 | Hattori et al. |
| 6,852,632 | B2 | 2/2005 | Wang et al. |
| 6,858,539 | B2 * | 2/2005 | Minamihaba et al. ........ 438/692 |
| 6,899,596 | B2 * | 5/2005 | Antonell et al. .............. 451/41 |
| 6,902,590 | B2 * | 6/2005 | Weinstein et al. ............. 51/298 |
| 2003/0181142 | A1 | 9/2003 | De Rege Thesauro et al. |
| 2003/0196386 | A1 | 10/2003 | Hattori et al. |
| 2003/0203624 | A1 | 10/2003 | Sameshima et al. |
| 2004/0014413 | A1 | 1/2004 | Kawahashi et al. |
| 2004/0063391 | A1 | 4/2004 | Hosaka et al. |
| 2004/0132305 | A1 | 7/2004 | Nishimoto et al. |
| 2004/0162011 | A1 | 8/2004 | Konno et al. |
| 2004/0166779 | A1 | 8/2004 | Balijepalli et al. |
| 2004/0173574 | A1 | 9/2004 | Grunwald |
| 2004/0235407 | A1 | 11/2004 | Grunwald |
| 2004/0266326 | A1 | 12/2004 | Shiho et al. |
| 2005/0026444 | A1 | 2/2005 | Babu et al. |
| 2006/0046490 | A1 | 3/2006 | Banerjee et al. |

FOREIGN PATENT DOCUMENTS

JP         2002 087398         3/2002

* cited by examiner

*Primary Examiner*—Lan Vinh
(74) *Attorney, Agent, or Firm*—Morgan Lewis & Bockius LLP

(57) ABSTRACT

The invention relates to chemical mechanical polishing of substrates using an abrasive and a fluid composition, wherein certain organosulfonic acid compounds are used as oxidizers, and particularly relates to a method of polishing substrates comprising copper, tungsten, titanium, and/or polysilicon using a chemical-mechanical polishing system comprising organosulfonic acids having an electrochemical oxidation potential greater than 0.2V as an oxidizer.

18 Claims, No Drawings

CMP METHOD FOR COPPER, TUNGSTEN, TITANIUM, POLYSILICON, AND OTHER SUBSTRATES USING ORGANOSULFONIC ACIDS AS OXIDIZERS

FIELD OF THE INVENTION

The invention relates to chemical mechanical polishing of substrates using an abrasive and a fluid composition, wherein certain organosulfonic acid compounds are used as oxidizers, and particularly relates to a method of polishing substrates comprising copper, tungsten, titanium, and/or polysilicon using a chemical-mechanical polishing system comprising organosulfonic acids having an electrochemical oxidation potential greater than 0.2V as an oxidizer.

DETAILED DESCRIPTION OF THE INVENTION

The compositions of the present invention are useful for the following processes: chemical mechanical polishing (CMP) of a substrate; post chemical mechanical polishing cleaners; resist removers to remove resists used in the manufacture of semiconductors from a substrate; and post-etch removers to remove residue after etching a substrate to form a pattern on the substrate.

In a first embodiment, the present invention seeks to achieve high CMP polishing selectivity between dielectrics and metals, and also between different metals and/or metal compounds, that are found on a substrate by using an organosulfonic acid oxidizer in a CMP composition. This embodiment of the invention includes a polishing method that uses an abrasive and a composition comprising at least one organosulfonic acid oxidizers of this invention. The composition can optionally contain one or more additives as described infra, and if the polishing composition contains suspended abrasives, the composition is often referred to as a slurry.

In another embodiment, the present invention seeks to achieve removal of CMP compositions from a substrate, where the CMP formulation was applied in a previous step. This embodiment of the invention includes a cleaning method that uses a composition comprising at least one organosulfonic acid oxidizers of this invention. The composition can optionally contain one or more additives as described infra.

In another embodiment, the present invention seeks to achieve removal of resist material from a substrate, where the resist material was applied in a previous step. This embodiment of the invention includes a cleaning method that uses a composition comprising at least one organosulfonic acid oxidizers of this invention. The composition can optionally contain one or more additives as described infra, and in many preferred embodiments comprises one or more polar organic solvents.

In another embodiment, the present invention seeks to achieve removal of post-etch residue material from a substrate, where the post-etch residue material is an organometallic residue that remains after etching a substrate in a previous step. This embodiment of the invention includes a cleaning method that uses a composition comprising at least one organosulfonic acid oxidizers of this invention. The composition can optionally contain one or more additives as described infra, and in many preferred embodiments comprises one or more polar organic solvents.

In each of these embodiments of the invention, the compositions may further include a hydroxylamine compound.

Substrates

The composition or slurry of this invention may be used to polish/clean at least one feature or layer on a substrate such as a semiconductor substrate or any other substrate associated with integrated circuits, a thin film transistor-liquid crystal display ("TFT-LCD"), a glass substrate, thin films, memory storage devices including memory disks, optical instruments including lens, nanotechnology machines, finely machined components including microscopic components, close tolerance machine parts, and micro-electro-mechanical systems structures, where smooth surfaces are desired on substrates containing features on the order of 0.1 nanometer to several micron size.

The present invention is particularly suitable for polishing/cleaning very high density semiconductor substrates, and is useful in various embodiments for all structures found thereon, including for example shallow trench isolation structures, LAN structures, silicon on insulator, deep gate structures, and the like. The term semiconductor as used herein means any devices including not only those formed over wafer of for example silicon, gallium arsenide (GaAs), silicon germanium (SiGe), GaAs on silicon substrate, or InP, but also those formed over a substrate such as TFT liquid crystal.

The compositions described herein are suitable for use on substrates that comprise, consist essentially of, or consist of any suitable metal, metal alloy, or metal compound such as nitride or carbides, metal composite, dielectrics, ferroelectric, organics, organometallics, or mixture thereof. The invention is particularly directed to methods of polishing structures on a substrate, the structures comprising iron, nickel, copper, tungsten, tantalum, aluminum, titanium, or alloys thereof, or compounds thereof, including nitrides and silicides, or any combination of the above. By way of example, the composition of the present invention may be used in the CMP of a substrate having one or more layers of aluminum, copper, copper aluminum alloy, nickel, nickel-phosphorus, nickel-iron, iron-phosphorus, SENDUST, CZT, tantalum, titanium, tungsten, or alloys thereof, or metal compounds thereof such as tantalum nitride, titanium nitride, titanium tungsten, or combinations thereof.

The compositions described herein are suitable for use on substrates that comprise, consist essentially of, or consist of strained silicon, polysilicon, single-crystal silicon, polycrystalline silicon, amorphous silicon, or silicon-on-insulator.

In selected preferred embodiments, the substrates comprise one or more of copper, tungsten, tantalum, polysilicon and/or titanium, or alloys of these metals, or compounds of these metals, or combinations thereof. In one embodiment there are metals/metal compounds comprising tungsten, tantalum, polysilicon and/or titanium layer form a barrier layer between a dielectric and a metal comprising copper. A barrier can be an adhesive film, for example, a TaN film, a WN film, a TiN film, or a layered film in which layers of Ti and TiN, Ta and TaN, or W and WN are present, or combinations of metals and metal nitrides, carbides, silicides, or the like.

Some embodiments of this invention are useful for polishing structures containing noble metals, for example one or more of ruthenium, iridium, platinum, gold, germanium, rhodium, palladium, and osmium.

The substrate can include dielectrics, for example metal oxides, TEOS, ferrodielectric material, and organic materials having a low dielectric constant ("low k"). The includes for example PZT ($PbZr_xTi_{1-x}O_3$), PLT, PLZT ($Pb_{1-y}La_yZr_xTi_{1-x}O_3$), SBT or BST ($Ba_xSr_{1-x}TiO_3$), where (0<x<1, 0<y<1), $PbTiO_3$, $SrTiO_3$, $SrBi_2Ta_2O_9$ and/or $BaTiO_3$, and $Ta_2O_5$. Generally, the polishing compositions of the present invention have very low polishing rates for these dielectric materials.

Organosulfonic Acid Oxidizers

The substrate is contacted with a chemical-mechanical polishing (CMP) system or with a cleaner/remover composition comprising an organosulfonic acid as an oxidizer. Preferred organosulfonic acid oxidizers have an electrochemical oxidation potential greater than 0.2V, for example greater than about 0.5V relative to SHE, and in preferred embodiments between about 0.7 V and about 1.5 V relative to SHE. The low electrochemical oxidation potential allows tailoring the composition to provide the desired combination of polishing selectivities. Additionally, polishing and post etch cleaning can be done with a tool that can itself apply an electrical potential, or an alternating electrical potential, as is known in the art.

In general, organosulfonic acid compounds can be represented by R—$SO_3H$, or the salt R—$SO_3^-$. The sulfonic acid moiety —$SO_3H$ and the sulfonate moiety R—$SO_3^-$ are used interchangeably herein.

Most sulfonic acid-containing compounds do not provide sufficient polishing/remover activity and selectivity.

The organosulfonic acid oxidizers of the current invention advantageously comprise at least one sulfonate substituted onto a ring structure. The preferred class of sulfonic acid oxidizers are those comprising one or more sulfonate moieties attached to a (multi-) cylic aromatic ring, e.g., where R is a phenyl ring. Another useful class of sulfonic acid oxidizers are those comprising one or more sulfonate moieties attached to an organic portion containing a single-ring or double-ring structure, where the ring(s) can be cyclic (i.e., comprise a plurality of carbon atoms) or heterocyclic (i.e., comprise one or more carbon atoms and a heteroatom, e.g., at least one N, at least one S, at least one O, or a combination thereof. In some embodiments more than one sulfonate moiety is attached to a ring structure described above. While there can in less preferred embodiments be a small, e.g., $C_1$ to $C_3$, alkyl chain between the aromatic ring and the sulfonate group, the preferred structure has a sulfonate moiety attached directly to the ring structure, for example to a benzene ring. Without being bound by theory, it is believed that the proximity of the ring increases the activity of the sulfonate moiety. There can, in another embodiment of this invention, be an oxygen between the ring structure and the sulfonic acid moiety.

In other preferred embodiments, the organosulfonic acid can have a ring structure with a sulfonate moiety attached and at least one other functional moiety (referred to herein as "polar substituents" or "polar groups," for convenience purposes only and without any intent to limit) also attached, e.g., another sulfonate moiety, a sulfate moiety, an amino moiety, a nitro moiety, a nitroso moiety, a hydroxyl moiety, a carboxylate moiety (COOH, COOR, or $COO^-R^+$), an alkoxy moiety such as a methoxy group, or the like, or a combination thereof. When there is only one other functional moiety attached to the ring structure, it may advantageously be at the ortho or meta position in relation to the sulfonate moiety, preferably at the ortho position. Steric placement of secondary functional groups is very important, especially when the structure comprises rings, where it is preferred that the polar substituents be in an ortho or a meta position, and not, for example, in a para position, relative to the sulfonate moiety. Without being bound by theory, it is believed that the polar groups may interact with the substrate to make the oxidative process more efficient.

It is also preferred that the polar group(s) in the ortho and/or meta position(s) is(are) substituted directly onto carbon atoms in the ring. Without being bound by theory, it is believed that the polar substituent in either (both) of those positions can provide greater affinity of the oxidizer to the substrate, or can increase the oxidative potential, or both. Furthermore, it is noted that multifunctional compounds, such as ortho- or meta- functional organosulfonic acids according to the invention, can act dually as oxidizing agents and chelating agents. Thus, without being bound by theory, it is surmised that the chelating activity of these oxidizers can render them more efficient in the compositions according to the invention. The ring can be optionally substituted with additional polar groups; however, in some cases too many polar groups can result in undesired and unstable molecules.

In less preferred embodiments the organosulfonic acids may include 4-methoxybenzenesulfonic acid; 4-hydroxybenzenesulfonic acid; 4-aminobenzenesulfonic acid; 4-nitrobenzenesulfonic acid; or the like; or a combination thereof. However, benzene-1,4-disulfonic acid provides sufficient activity.

In less preferred embodiments, the organosulfonic acids may include benzenesulfonic acid; benzylsulfonic acid (i.e., α-toluenesulfonic acid); alkylbenzenesulfonic acids such as toluenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, tridecylbenzenesulfonic acid, tetradecylbenzene sulfonic acid, hexadecylbenzene sulfonic acid, etc.; and the like.

Another useful class of sulfonic acid oxidizers are those comprising one or more sulfonate moieties attached to a ring structure where the ring is heterocyclic (i.e., comprises at least one C and one or more of N, S, and O). Advantageously, the sulfonate group is attached to a ring carbon (herein the point of attachment of a sulfonate moiety is called position 1). Advantageously, compounds in this class have N, S, or O in the ortho or meta position in the ring relative to the sulfonate moiety, most preferably in the meta position. Such a compound does not need additional polar substituents on the ring, though one or more additional functional groups can be provided.

Another useful class of sulfonic acid oxidizers are those comprising one or more sulfonate moieties attached to a heterocyclic ring structure. Advantageously, the sulfonate group is attached to a ring carbon, and the ring further comprises a polar substituent from the group previously presented in the ortho or meta position in the ring, most preferably in the meta position. The polar substituent may be substituted directly on the ring or can be spaced from the ring via a $C_1$ to $C_4$ alkyl group and/or an —O— linkage.

The particular organosulfonic oxidizers useful with particular substrates can be easily determined by one of ordinary skill in the art with the benefit of this disclosure.

A preferred class of organosulfonic acid oxidizers of this invention are those having a second sulfonate moiety or a nitro moiety in a meta position relative to the (first) sulfonate moiety on the cyclic or heterocyclic ring structure. Generally it is preferred to have at most one other sulfonate/nitro substituent in the ortho or meta positions to the sulfonate moiety on the ring, although it is contemplated that a functional group may additionally be present in the para position to the sulfonate moiety without significantly decreasing the activity of the compound.

A preferred organosulfonic acid is 3-nitrobenzenesulfonic acid, or meta-nitrobenzenesulfonic acid. This organosulfonic acid provides excellent selectivity between copper and other structure normally found on a substrate having copper, for example dielectrics and/or barrier materials such as TaN. High copper rates can be achieved with good non-uniformity. This oxidizer has a broad pH process window, that is, the range in pH where commercially acceptable polishing rates and non-uniformity values can be obtained.

In another embodiment other nitro-substituted organosulfonic acids having an oxidizing capacity include 2-nitrobenzenesulfonic acid; 2-nitronaphthalenesulfonic acid; 3-nitronaphthalenesulfonic acid; 2,3-dinitrobenzenesulfonic acid; 2,4-dinitrobenzenesulfonic acid; 2,5-dinitrobenzenesulfonic acid; 2,6-dinitrobenzenesulfonic acid; 3,5-dinitrobenzenesulfonic acid; 2,4,6-trinitrobenzenesulfonic acid; and the like.

Another preferred embodiment are amino-substituted organosulfonic acids having an oxidizing capacity, for example 3-aminobenzenesulfonic acid (Metanilic acid, CAS No. 121-47-1). Metanilic acid was found to have, under appropriate conditions, an electrochemical oxidizing potential of about 1.16 V relative to SHE. This preferred organosulfonic oxidizing agent can be used in certain embodiments of the present invention, for example the removal of (100) crystalline silicon. In another embodiment other amino-substituted organosulfonic acids having an oxidizing capacity include 2-aminobenzenesulfonic acid; 2-aminonaphthalenesulfonic acid; 3-aminonaphthalenesulfonic acid; 2,3-diaminobenzenesulfonic acid; 2,4-diaminobenzenesulfonic acid; 2,5-diaminobenzenesulfonic acid; 2,6-diaminobenzenesulfonic acid; 3,5-diaminobenzenesulfonic acid; 2,4,6-triaminobenzenesulfonic acid; and the like.

Another preferred embodiment are sulfonate-substituted organosulfonic acids having an oxidizing capacity, for example benzene-1,3-disulfonic acid. This preferred organosulfonic oxidizing agent can be used in certain embodiments of the present invention to polish metals needing a stronger oxidizer. In another embodiment other sulfonate-substituted organosulfonic acids having an oxidizing capacity can include benzene-1,2-disulfonic acid; naphthalene-1,2-disulfonic acid; naphthalene-1,3-disulfonic acid; benzene-1,2,3-trisulfonic acid; benzene-1,2,4-trisulfonic acid; benzene-1,2,5-trisulfonic acid; benzene-1,3,4-trisulfonic acid; benzene-1,3,5-trisulfonic acid; benzene-1,2,4,5-tetrasulfonic acid; benzene-1,3,4,5-tetrasulfonic acid; and the like. As mentioned above, benzene-1,4-disulfonic acid may optionally be included in these embodiments.

In yet another embodiment hydroxy-substituted organosulfonic acids having an oxidizing capacity are useful, for example including 3-hydroxybenzenesulfonic acid; 2-hydroxybenzenesulfonic acid; 2-hydroxynaphthalenesulfonic acid; 3-hydroxynaphthalenesulfonic acid; 2,3-dihydroxybenzenesulfonic acid; 2,4-dihydroxybenzenesulfonic acid; 2,5-dihydroxybenzenesulfonic acid; 2,6-dihydroxybenzenesulfonic acid; 3,5-dihydroxybenzenesulfonic acid; 2,3,4-trihydroxybenzenesulfonic acid; 2,3,5-trihydroxybenzenesulfonic acid; 2,3,6-trihydroxybenzenesulfonic acid; 2,4,5-trihydroxybenzenesulfonic acid; 2,4,6-trihydroxybenzenesulfonic acid; 3,4,5-trihydroxybenzenesulfonic acid; 2,3,4,5-tetrahydroxybenzenesulfonic acid; 2,3,4,6-tetrahydroxybenzenesulfonic acid; 2,3,5,6-tetrahydroxybenzenesulfonic acid; 2,4,5,6-tetrahydroxybenzenesulfonic acid; and the like.

In yet another embodiment methoxy-substituted organosulfonic acids having an oxidizing capacity are useful, for example including 3-methoxybenzenesulfonic acid; 2-methoxybenzenesulfonic acid; 2,3-dimethoxybenzenesulfonic acid; 2,4-dimethoxybenzenesulfonic acid; 2,5-dimethoxybenzenesulfonic acid; 2,6-dimethoxybenzenesulfonic acid; 3,5-dimethoxybenzenesulfonic acid; 2,4,6-trimethoxybenzenesulfonic acid; and the like.

In yet another embodiment sulfamic acid-substituted organosulfonic acids having an oxidizing capacity are useful, for example including benzenesulfonic acid-3-sulfamic acid; benzenesulfonic acid-2-sulfamic acid; naphthalenesulfonic acid-2-sulfamic acid; naphthalenesulfonic acid-3-sulfamic acid; benzenesulfonic acid-2,3-disulfamic acid; benzenesulfonic acid-2,4-disulfamic acid; benzenesulfonic acid-2,5-disulfamic acid; benzenesulfonic acid-2,6-disulfamic acid; benzenesulfonic acid-3,4-disulfamic acid; benzenesulfonic acid-3,5-disulfamic acid; and the like.

Of course, any of the above polar substituents can be admixed, to make for example 3-nitro-4-hydroxy-benzenesulfonic acid; 3-nitro-5-hydroxy-benzenesulfonic acid; 2-nitro-4-hydroxy-benzenesulfonic acid; 2-hydroxy-4-nitro-benzenesulfonic acid; 4-hydroxy-benzene-1,3-disulfonic acid; 2-hydroxy-benzene-1,4-disulfonic acid; 2-nitro-benzene-1,4-disulfonic acid; 3-amino-4-methoxybenzenesulfonic acid; benzenesulfonic acid-3,4-dicarboxylic acid (i.e., 4-sulfo-1,2-benzenedicarboxylic acid); 2-carboxy-4-nitrobenzenesulfonic acid (i.e., 4-nitro-2-sulfo-benzoic acid); and the like.

Other useful organosulfonic acids having an oxidizing capacity, though less oxidative activity that the aforementioned substituted benzenesulfonic acids, include, e.g., unsubstituted benzenesulfonic acid and unsubstituted naphthalenesulfonic acid.

The benzene ring is not the only ring structure useful for this invention. One or more sulfonate moieties can be attached to any 5- or 6-membered ring (e.g., aromatic ring), or less preferably to a double ring structure, again with the optional functional groups (e.g., nitro, hydroxyl, and/or amino groups) attached thereto in an ortho position or in a meta position, and less preferably in a para position. For example, other useful organosulfonic acids having an oxidizing capacity include 2-pyridinesulfonic acid, 3-pyridinesulfonic acid, and the like, which may optionally be substituted with a functional group mentioned above (e.g., such as hydroxy, nitro, sulfonate, carboxylate, methoxy, or amino moiety, or mixtures thereof), to form, for example, 3-nitro-2-pyridinesulfonic acid. Additionally or alternately, instead of a pyridine, naphthyl, or phenyl ring structure, the organosulfonic acid compound can have a different aromatic or aromatic-containing ring structure, including but not limited to a fluorene, anthracene, pyrene, biphenyl, quadrene, pyridazine, bipyridine, quinoline, phenanthroline, phenanthridine, pyrimidine, pyrazine, triazine, benzothiazole, benzotriazole, benzimidazole, or the like.

In another embodiment, the organosulfonic acid compound ring structure can be cyclic or heterocyclic but not aromatic, including, e.g., cyclohexane, piperazine, piperidine, morpholine, pyrrolidine, pyrroline, pyrazole, pyrrole, furan, a hydrofuran, pyran, a hydropyran, thiophene, thiazole, triazole, a hydropyridine, imidazole, imidazoline, imidazolidine, purine, dioxane, trioxane, oxazole, oxazine, indole, indoline, isoindole, carbazole, and the like.

In addition to or as an alternative to the disclosed additional functional moiety(ies) on the organosulfonic acid compound, in some embodiments it may be acceptable or even desirable for relatively non-polar groups such as alkyl moieties, hydrocarbon moieties, and/or halides, to be attached, e.g., to the ring structure. Examples of such compounds can include, but are not limited to, e.g., 2-amino-5-methylmenzenesulfonic acid, 2-chloro-5-nitrobenzenesulfonic acid, 2-methyl-5-nitrobenzenesulfonic acid, and the like.

Of course, the invention encompasses compositions and slurries containing one or a plurality of organosulfonic acids having an oxidizing capacity as exemplified above, in relative amounts for a slurry having a plurality of organosulfonic acids of between about 1:20 to about 20:1. Additionally, the invention encompasses salts of any and each organosulfonic acids having an oxidizing capacity, particularly non-metal-containing salts thereof.

The amount of the organosulfonic acid(s) present is advantageously between about 0.1% to about 20% by weight, for example between about 1% and about 15% by weight, based on the weight of the fluid composition.

In one embodiment, the amount of organosulfonic acids of the current invention range from between about 2% and about 6% by weight, based on the weight of the fluid composition.

In another embodiment, the amount of organosulfonic acids of the current invention range from between about 6% and about 13% by weight, based on the weight of the fluid composition.

Other Oxidizers

In preferred embodiments, the polishing composition or slurry comprising the organosulfonic oxidizer(s) of this invention are substantially free of other traditional oxidizers, particularly peroxides including hydrogen peroxide, hydrohydrogen peroxide, and urea hydrogen peroxide; persulfates including ammonium persulfates and dipersulfates; ferric salts; aluminum salts; periodic acid; periodates; and/or peracetic acid. As used herein, the term substantially free as it pertains to other oxidizers means less than about 0.1% by weight, for example less than about 0.01% by weight, and most preferably completely free of the component. These oxidizers generally have a much greater electrochemical potential than the organosulfonic acids of the present invention, and will tend to oxidize various compounds on the substrate somewhat indiscriminately, and thereby negate the selective oxidation of particular components (and resultant high selectivity) possible when using the organosulfonic acid compounds of the present invention. If present, these oxidizers should be used in an amount between about 0.01% and about 1% by weight, for example between about 0.01% and about 0.5% by weight, based on the weight of the fluid composition.

In another embodiment, the polishing composition or slurry is substantially free of hydroxylamines, or adducts or salts (i.e., derivatives) thereof, or combinations thereof.

However, in another preferred embodiment, the polishing composition or slurry comprises hydroxylamine or a derivative thereof and a organosulfonic acid oxidizer of the present invention. Salts of hydroxylamines include hydroxylamine nitrate, hydroxylamine sulfate, hydroxylamine phosphate, and the like. Adducts of hydroxylamine include the compound where each R of the $R_2N$—OR compound is independently hydrogen or a linear, branched, or cyclic hydrocarbon containing from 1 to 7 carbon atoms. Adducts of hydroxylamine can be present in salt form as well, e.g., as nitrates, sulfates, phosphates, or the like, or a combination thereof. The hydroxylamine electrochemical potential is variable depending on organic constituents, salts, and pH, and therefore depending on the composition can be within the same range as the electrochemical potential of the organosulfonic acids of the present invention. In such a composition, selectivity can be maintained, and conditions can be altered slightly to effect changes in the polishing selectivity between structures comprising different metals. If present, the hydroxylamine oxidizers should be used in an amount, based on the weight of the fluid composition, from about 0.001% to about 15% by weight, for example from about 0.1% to about 5% by weight, from about 0.01% to about 2% by weight, from about 0.001% to about 1% by weight, from about 0.001% to about 0.1% by weight, from about 0.01% to about 1% by weight, or from about 4% to about 10% by weight.

Polar Solvents

The polishing compositions of the current invention comprises a polar solvent, and for most embodiments a preferred polar solvent is water. The water is advantageously purified, deionized, or otherwise treated so that the dissolved metals content prior to polishing is less than about 30 ppm, preferably less than about 3 ppm. The water is present in an amount above about 60%, for example in an amount greater than about 80%, by weight based on the weight of the fluid composition.

A preferred embodiment comprises water as the only solvent and is substantially free of polar organic solvents.

The composition can optionally contain one or more polar organic solvents, for example glycols, alkanolamines, sulfoxides such as DMSO, pyridienes including alkyl-substituted embodiments such as NMP, alcohols, or mixtures thereof, in a waterless composition or in combination with water. Solvents are especially useful when using the organosulfonic oxidizers of this invention in a method for removing resist and/or for removing post-etch residue. Solvents can be useful when using the organosulfonic oxidizers of this invention in a method for removing previously applied CMP slurries.

Additives

The following is a list of additives that can optionally be included in any composition or slurry of the present invention, including acids/bases; chelators; corrosion inhibitors; surfactants; rheological agents; and the like; as well as combinations thereof. However, embodiments that are substantially free of any one or any combination of these additives are also contemplated.

Acids/Bases

The polishing compositions of the current invention can comprise pH adjusting compounds. The pH of the solutions and slurries are beneficially adjusted with non-metal-containing acids and bases. Sulfates, as sulfuric acid or ammonium sulfate, are useful. Nitric acid and ammonium nitrate are also preferred. Other options include phosphoric acid, phosphonic acids, sulfonic acids (including those with oxidizing potential), hydrochloric acid, organic acids, as well as substituted or unsubstituted ammonium and/or hydroxylamine compounds. Preferred pH adjustors are sulfuric acid, nitric acid, ammonium hydroxide, TMAH, ammonium nitrate, ammonium sulfate, or combinations thereof. The pH of the system can be held within a range of from about 1 to about 12, but for worker safety the preferred pH is from about 2 to about 11, for example from about 3 to about 9.

The effective pH window for selected organosulfonic acid oxidizers of this invention is wider than that of traditional oxidizers. The effective pH window for slurries having a hydroxylamine and a organosulfonic acid oxidizer of this invention is wider than that of traditional oxidizers.

The preferred pH range for polishing copper is between about 1.5 and about 7, for example between about 3 and about 6.

The preferred pH range for polishing tungsten is between about 1.5 and about 12, for example between about 1.5 and about 7 or between about 3 and about 6, alternately between about 7 and about 11 or between about 7.5 and about 10.

The preferred pH range for polishing aluminum is between about 3 and about 9, for example between about 4 and about 7.

The preferred pH range for polishing polysilicon is about 1 to about 12, in some embodiments from about 4 to about 10, for example from about 4.8 to about 9. Interestingly, polishing rates are higher at the ends of the pH range (from about 1.5 to about 3 and from about 7.5 to about 10) than in the middle of this range.

The preferred pH range for polishing noble metals is about 1 to 12, for example from about 2 to about 9, in some embodiments from about 2 to about 5.

The particular pH can be selected by one of ordinary skill in the art without undue experimentation, with the benefit of this disclosure, for the particular materials on a given substrate and desired selectivity for each material. Of course, acids and bases can both be added to achieve a buffer to maintain a stable pH during polishing.

Chelators

Any suitable complexing agent (i.e., chelating agent or selectivity enhancer) can be used in conjunction with the inventive method. Suitable complexing agents include, for example, carbonyl compounds (e.g., acetylacetonates), simple carboxylates (e.g., aryl carboxylates), carboxylates containing a hydroxyl group (e.g., glycolates, lactates, gluconates, gallic acid), di-, tri-, or poly-carboxylates (e.g., oxalates, phthalates, citrates, succinates, tartrates, malates, and edetates such as EDTA), and carboxylates containing one or more sulfonic and/or phosphonic groups. Suitable chelating or complexing agents also can include, for example, di-, tri-, or poly-alcohols (e.g., ethylene glycol, pyrocatechol, pyrogallol, tannic acid, and the like) and phosphate-containing compounds, e.g., phosphonium salts, and phosphonic acids. Complexing agents also can include amine-containing compounds (e.g., amino acids, amino alcohols, di-, tri-, and poly-amines, and the like). Preferred chelators include for example EDTA, DPTA, multivalent organic acids including citric acid, oxalic acid, and/or gallic acid, polyhydroxyaromatics including catechols, and/or organosulfamic acid compounds.

If present, chelators are beneficially present in an amount be present in an amount between about 0.01% and about 12% by weight, for example between about 0.5% and about 6%, based on the weight of the fluid composition. Some chelators, especially at higher concentrations, act as corrosion inhibitors.

Corrosion Inhibitors

Any suitable film-forming agent (e.g., corrosion-inhibitor) can be used in conjunction with the inventive method. For example, suitable film-forming agents generally include surface-active agents that preferentially adsorb to selected portions of the substrate. Therefore, suitable film-forming agents include, for example, amine-containing compounds such as primary, secondary, tertiary, and quaternary amines and amino acids, alkylamines, alkanolamines, hydroxylamines, phosphate esters, sodium lauryl sulfate, fatty acids, polyacrylates, polymethacrylates, polyvinylphosphonates, polymalate, polystyrenesulfonate, and polyvinylsulfonate. Other suitable film-forming agents include, for example, benzotriazole, triazole, benzimidazole, and mixtures thereof.

In one embodiment, the corrosion inhibitor does not include catechol; a $C_1$–$C_6$ alkylcatechol such as methylcatechol, ethylcatechol and tertbutylcatechol; benzotriazole; $C_1$–$C_{10}$ alkylbenzotriazoles; gallic acid; and/or gallic acid esters such as methyl gallate and propyl gallate.

If present, corrosion inhibitors are beneficially present in an amount between about 0.01% and about 5% by weight, based on the weight of the fluid composition.

Surfactants

If a surfactant is added to the first CMP slurry, then it may be an anionic, cationic, nonionic, or amphoteric surfactant or a combination of two or more surfactants can be employed. Furthermore, it has been found that the addition of a surfactant may be useful to reduce the within-wafer-non-uniformity (WIWNU) of the wafers, thereby improving the surface of the wafer and reducing wafer defects. While there are many suitable surfactant additives for the composition, preferred surfactant additives include dodecyl sulfate sodium salt, sodium lauryl sulfate, dodecyl sulfate ammonium salt, and any combination thereof. Suitable commercially available surfactants include TRITON DF 16™ manufactured by Union Carbide and SURFYNOL™ manufactured by Air Products and Chemicals.

Various anionic and cationic surfactants having molecular weight in the range from less than about 1000 Daltons to greater than about 30,000 Daltons are contemplated as dispersants. Included are sodium, potassium, or preferably ammonium salts of stearate, lauryl sulfate, alkyl polyphosphate, dodecyl benzene sulfonate, disopropylnaphthalene sulfonate, dioctylsulfosuccinate, ethoxylated and sulfated lauryl alcohol, and ethoxylated and sulfated alkyl phenol.

Various cationic surfactants include polyethyleneimine, ethoxylated fatty amine and stearylbenzyldimethylammonium chloride or nitrate. Alternate dispersants contemplated in the present invention include: polyethylene glycols, lecithin, polyvinyl pyrrolidone, polyoxyethylene, isooctylphenyl ether, polyoxyethylene nonylphenyl ether, amine salts of alkylaryl sulfonates, polyacrylate and related salts, polymethacrylate.

If present, surfactants are beneficially present in an amount between about 0.01% and about 3% by weight, based on the weight of the fluid composition.

Rheological Agents

Any suitable rheological control agent can be used in conjunction with the inventive method, including viscosity enhancing agents and coagulants. Suitable rheological control agents include, for example, polymeric rheological control agents. Moreover, suitable rheological control agents include, for example, urethane polymers (e.g., urethane polymers with a molecular weight greater than about 100,000 Daltons), acrylates comprising one or more acrylic subunits (e.g., vinyl acrylates and styrene acrylates), and polymers, copolymers, and oligomers thereof, and salts thereof. The rheological agents include for example polycarboxylic acids, polyolefins including polystyrene, ethoxy-block copolymers, polymeric surfactants, polyalkyleneimines, and the like. Molecular weights of rheological aids vary, but are typically between 2000 Daltons and 1,500,000 Daltons, generally 5000 to 500,000 Daltons.

If present, rheological agents are beneficially present in an amount from about 0.01% to 2% by weight, based on the weight of the fluid composition.

Abrasives

The compositions of the present invention are useful for the following processes: chemical mechanical polishing (CMP) of a substrate; post chemical mechanical polishing cleaners; resist removers to remove resists used in the manufacture of semiconductors from a substrate; and post-etch removers to remove residue after etching a substrate to form a pattern on the substrate. Of these processes, while abrasives can be used in any of the above, generally the abrasives are most typically included only in the CMP compositions. The CMP composition typically comprises an abrasive, though in some embodiments an abrasive pad is used, and the CMP composition can be substantially free of abrasives.

Examples of suitable abrasive particles include, but are not limited to, metal oxides including alumina, silica, ceria ($CeO_2$), $Ce_2O_3$, titania ($TiO_2$), $Ti_2O_3$, particles with mixed titanium oxides, zirconia, manganese dioxide, yttrium oxide ($Y_2O_3$) particles, $Fe_2O_3$ particles; $Fe_3O_4$ particles, tin oxide, germania, zirconia, copper oxide, nickel oxide, tungsten oxide, as well as spinels comprising one or more of Al, Mg, Zn, and Fe; and abrasive compounds other than oxides, for example metal (of the metals listed in the preceding oxides) nitrides such as zirconium nitride, metal (of the metals listed in the preceding oxides) carbides, e.g., silicon carbide, titanium carbide, or tungsten carbide; metal (of the metals listed in the preceding oxides) silicides; or ceramics such as metal (of the metals listed in the preceding oxides) titanate, tantalate, zirconate, metal-germanium oxide, niobate, boride, or combinations thereof; boron carbide; polycrystalline diamond; garnet; carborundum; polymer/metal oxide composites; or mixtures of any of the above.

Preferred abrasives are silica, ceria, alumina, spinels, or mixtures thereof.

Another preferred abrasive is a coated abrasive, that is, an abrasive comprising a first material partially or fully coating a second material, where at least one of the first material or second material is an abrasive as described herein. Examples include the alumina-coated silica used in an example described infra.

By way of example, the alumina may be an alpha-alumina, a gamma-alumina, colloidal alumina, fused alumina, ceramic alumina, or other aluminas known in the art, or a combination thereof. The silica can be colloidal, fumed, or any other type known in the art, or combinations thereof. The ceria can be colloidal, fumed, or any other type known in the art, or combinations thereof.

An abrasive particle is a solid with a size between about 0.0005 microns and about 1 micron. In preferred preparations, the coated particles have an average particle size of less than about 0.2 microns (200 nm), preferably having an average particle size of about 0.1 microns or less, for example a composition where about 90% or more of the abrasive particles (by number) have a particle size less than about 30 nm. There is no particular minimum diameter. With very small, i.e., between about 0.001 micron and 0.01 micron particles are used, polishing rates are very slow, but finer patterns can be polished with fewer defects. Various embodiments use abrasive particles of average size 0.1 to 0.4 microns, alternatively 0.05 to 0.15 microns, alternatively 0.04 to 0.1 microns; alternatively 0.005 to 0.05 microns, where different sizes are used for different substrates and with regard to the acceptable amount (depth) of scratches where scratches do not prevent further manufacture of the product, as is known in the art.

When abrasive size is mentioned, the size is the average particle diameter, which can be measured by for example microscopic examination, or by other techniques generally used in the industry. The surface area of the abrasives can vary widely, for example between about 1 and about 2000 square meters per gram, as measured by BET. When size ranges are specified, for example, from about 10 to about 80 nanometers, this means that the average particle size falls within those extremes, but preferably the individual particles have a size distribution such that substantially all particles, i.e., at least about 95% by count (for a single mode composition) have sizes within about 30%, preferably within about 10%, of the average particle diameter.

The abrasive particles may form aggregates, which are particles loosely or strongly held together in clumps, where the number of particles in an aggregate depends largely on the chemistry of the composition and on the particle size. Aggregates have substantially the same length and width dimensions (or major and minor diameters), or these values are within at least about 70% of each other, and have a plurality of particles interconnected such that a plurality of particles contact at least three other particles. Such aggregates can be desirable because they have high polishing rates as found with bigger particles but also have some resiliency, which reduces gouging. Particularly preferred for very fine features are abrasives in aggregate form with a particle size of about 15 nanometers (about 0.015 microns) with an aggregate size of about 0.03 to about 0.05 microns, or abrasive with a particle size of about 7 nanometers (about 0.007 microns) with an aggregate size of about 0.02 to about 0.04 microns.

The abrasive may also form a chain structure with a length-to-width ratio of at least about 4, preferably at least about 6, and in some embodiments at least about 10. The chain is not a single long crystal, but is a mass of small individual, preferably substantially spherical silica particles bound end to end. The chain width preferably substantially one particle, though in less preferred embodiment the width may between about 2 and about 4 particles, where the length to width ratio is based on the maximum width measured in a width direction. A particularly preferred chain is formed of particles having an average diameter of between about 3 and about 20 nanometers.

Of course, it is realized that formulations may and usually do contain a plurality of structures, be they monodisperse particles, cocoon shaped particles, cocoon-shaped particles formed of bound substantially spherical particles, chains, and aggregates.

Additionally, the size distribution of the abrasives can be single modal, bi-modal, or polymodal. Of course, as the number of sizes increase, the control advantages of having a narrow size distribution decline. In most bi-modal embodiments, the two sizes differ from one-another by less than a factor of about three. However, polymodal size distributions exhibit excellent polishing characteristics and low defects if the smaller particle is less than 4 times, and even less than about 10 times, the size of the larger particles.

The amount of abrasive can be from about 0.1% to about 30% by weight, for example between about 1% and about 15% by weight, based on the weight of the fluid composition.

Method of Use

Chemical Mechanical Polishing—The general method of use is to provide the composition or slurry in an amount typically between about 20 ml/min to 250 ml/min to a volume between a substrate and a polishing pad, with a small amount of pressure such as between 2 and 12 psi, at a temperature between about ambient and about 70 C, where the pad is moved relative to the substrate, for example by rotating the pad and/or rotating a platen on which the substrate is mounted, for example between about 10 and about 200 rpm for either or both. Use of the compositions and processes of the present invention may reduce, minimize or eliminate imperfections, defects, corrosion, recession and/or erosion that might otherwise appear on the substrate surfaces.

Cleaning—The general method is to provide the composition, optionally with scrubbing, brushing, wiping, sonicating, applying an electric potential or alternating field to repel residual material from the substrate, pulsed impinging with jets, and the like as is known in the industry, for a time and at a temperature necessary to remove the desired substrates. The resist removing/post etch removing/post CMP cleaning compositions are typically used at a temperature between about ambient and about 70 C, for a time between a few seconds and several minutes, where the time and temperature vary with the aggressiveness of the composition and with the material desired to be removed. The organosulfonic acid oxidizers of the present composition may in some cases provide oxidizing potential to remove organic (polymeric resists), metallic, and/or organometallic contaminants, and may additionally provide a chelation effect to keep contaminants from the substrate.

EXAMPLES

Processes described herein are generally a series of five numbers separated by dashes such as 11/22/33/44/55, where the numbers represent, respectively, down force pressure of 11 psi, a back pressure of 22 psi, a table speed of 33 rpm, a carrier (platen) speed of 44 rpm, and a composition flow rate of 55 ml/min.

Slurries can be pre-mixed or mixed at point of use.

Comparative Example 1

This example illustrates the high barrier removal rates and low selectivities that are achieved in methods using the presently existing CMP solutions for substrates comprising copper. This example serves as a baseline for the subsequent examples, which employ CMP solutions that improve upon the selectivity between the metal layer and a barrier layer.

In a test using a TW711 pad and a 6/0/110/95/150 process with a formulation comprising 291 AMD:267 $SiO_2$ at dilution of 1.5 oxidizer:1 slurry:2.5 water at a pH of 3.7, the resultant tungsten removal rate (W-RR) was 7860 Angstroms (Å)/minute and the resultant TEOS removal rate (TEOS-RR) was 801 Å/minute, for a W:TEOS selectivity of about 10. The 6/0/110/95/150 process refers to a CMP process carried out employing a downward force of 6 psi, a back pressure of 0 psi, a table speed of 110 rpm, a carrier speed of 95 rpm, and a composition flow rate of 150 ml/minute.

In a second comparative example using a 5/0/90/95/150 process with a formulation comprising 291 oxidizer:B95 slurry (10%) at dilution of 1.5 oxidizer:1.5 slurry:2 water and a pH of 4.8, the resultant copper removal rate (Cu-RR) was less than 1500 Angstroms (Å)/minute. The approximate Cu:TEOS selectivity is about 2.

Example 1

This example demonstrates the effect of polishing a substrate comprising copper with a solution comprising 3-nitrobenzene sulfonic acid as an oxidizer.

A polishing solution with a pH of around 4.8, which comprised about 5 wt. % 3-nitrobenzene sulfonic acid, sodium salt (commercially purchased as LUDIGOL); about 5 wt. % alumina; and about 90 wt. % deionized water was used in the test to contact both a TW711 pad and a C518 copper wafer. When exposed to the polishing composition, the pad turned a dark gray green color. This example used a TW711 pad and 5/0/90/95/150 process parameters, 5% of the sodium salt of 3-nitrobenzenesulfonic acid which is available commercially under the tradename Ludigol, and 5% alumina at dilution of 1.5 oxidizer: 1.5 slurry:2 water at a pH of at a pH of 4.8. The formulation when used on a previously used copper-coated wafer had a resultant copper removal rate (Cu-RR) of 943 Å/minute. When the formulation was tested on a new TEOS and copper-coated wafer, the Cu-RR was 3850 Å/minute, while the TEOS-RR was 324 Å/minute, for a Cu:TEOS selectivity of about 12.

When the formulation was tested on a new TEOS, TaN, and copper-coated wafer with process parameters 2/0/90/95/150, the Cu-RR was 1900 Å/minute, the TaN-RR was 17 Å/minute, and the TEOS-RR was 150 Å/minute, for a Cu:TEOS selectivity of about 13.

Comparative Example 2

Another baseline test was conducted using a IC 1000 pad and CU 472-001 copper. The composition in this test comprised 1.5% Hydrogen peroxide, 1.5% 266 B, and the remainder deionized water. The pH was adjusted to 4. Using a 6/0/110/90/200 process with a IC-1000 pad on a Cu-472-001 wafer, the W-RR was 1030 Å/minute and the Cu-RR was 905 Å/minute.

Example 2

This example demonstrates the effect of polishing a substrate comprising copper with a solution comprising 3-nitrobenzene sulfonic acid as an oxidizer.

A polishing solution with a pH of around 4.7, which comprised about 5 wt. % 3-nitrobenzene sulfonic acid, sodium salt (commercially purchased as Ludigol); about 5 wt. % alumina; and about 90 wt. % deionized water was used in the test to contact both a TW711 pad and a C518 copper wafer. Using a 5/0/90/95/175 process with a IC-1000 pad on a Cu-472-001 wafer, the Cu-RR was 1150 Å/minute.

Using the same formulations and a 2/0/90/95/175 process the TEOS-RR was 153 Å/minute and the TaN-RR was 6.18 Å/minute.

Example 3

This example demonstrates the effect of polishing a substrate comprising copper with a solution comprising 3-nitrobenzene sulfonic acid as an oxidizer, at pH values of 2 and 7.

A polishing solution with a pH of 2, which comprised about 5 wt. % 3-nitrobenzene sulfonic acid, sodium salt; about 5 wt. % alumina; about 90 wt. % deionized water, and sufficient $HNO_3$ to adjust to pH 2 (about 0.11% $HNO_3$) was used in the test to contact both a IC 1000 pad and 472-001 Cu. When exposed to the polishing composition, the pad turned black but was easy to clean. Using a 2/0/90/95/175 process with a IC-1000 pad on a Cu-472-001 wafer, the Cu-RR was 1780 Å/minute, and the TaN-RR was 8 Å/minute.

A polishing solution with a pH of 7, which comprised about 5 wt. % 3-nitrobenzene sulfonic acid, sodium salt;

about 5 wt. % alumina; about 90 wt. % deionized water, and sufficient KOH to adjust to pH 7 (about 0.03% KOH) was used in the test to contact both a IC 1000 pad and 472-001 Cu. Using a 5/0/90/95/175 process, the Cu-RR was 1140 Å/minute, and the TaN-RR was 14 Å/minute. At the conclusion of the polishing, the copper looked dark with a lot of scratches.

Example 4

A polishing solution with a pH of about 2.25, which comprised about 5 wt. % 3-nitrobenzene sulfonic acid, sodium salt; about 5 wt. % alumina; about 1 wt. % citric acid; and about 89 wt. % deionized water was used. Under process conditions of 5/0/90/95/175, the Cu-RR was 1800 Å/minute. Under process conditions of 2/0/90/95/175 with a IC-1000 pad on a Cu-472-001 wafer, the TaN-RR was 6 Å/minute. The pad was dark but the copper was shiny.

Example 5

A polishing solution which comprised about 5 wt. % 3-nitrobenzene sulfonic acid, sodium salt; about 5 wt. % alumina; about 1 wt. % citric acid; about 200 ppm benzotriazole (BTA); and about 89 wt. % deionized water was used. Under process conditions of 2/0/90/95/175 with a IC-1000 pad on a Cu-472-001 wafer, and a pH between 2 and 3, the Cu-RR was 2810 Å/minute.

Example 6

A polishing solution with a pH of around 8.5, which comprised about 5 wt. % 3-nitrobenzene sulfonic acid, sodium salt (commercially purchased as Ludigol); about 5 wt. % alumina; sufficient hydroxylamine to give a pH of 8.5, and about 89 wt. % deionized water using a 4/0/90/90/175 (60) process and a POLITEX Cu-polishing pad gave a Cu-RR of 1590 Å/minute and the TaN-RR was 2010 Å/minute. The TEOS-RR was 93 Å/minute, but the surface was hard to clean.

The process parameters were adjusted to 2/0/90/90/175 (60), and decreasing the pressure by half was found to not have much effect on the Cu-RR. The Cu-RR was 1320 Å/minute, the TaN-RR was 1220 Å/minute, and the TEOS-RR was 106 Å/minute.

Example 7

A composition having about 5 wt. % 3-nitrobenzene sulfonic acid, sodium salt; about 5 wt. % alumina; about 1 wt. % citric acid; and about 89 wt. % deionized water was used in this test. The pH was about 2.2. Under process conditions of 4/0/90/90/175 with a POLITEX pad, the Cu-RR was 550 Å/minute and the TaN-RR was 43 Å/minute.

Using the same composition, except that the pH was adjusted to 5 with 10 g of 50% hydroxylamine (commercially available under the tradename HDA) per 1500 grams slurry to give a formulation having about 5 wt. % 3-nitrobenzene sulfonic acid, sodium salt; about 5 wt. % alumina; about 1 wt. % citric acid; about 0.33% hydroxylamine, and about 89 wt. % deionized water, and under the same process conditions of 4/0/90/90/175 with a POLITEX pad, the Cu-RR was 2170 Å/minute and the TaN-RR was 825 Å/minute. Small amounts, i.e., 0.1% to 0.5%, of hydroxylamine can increase the Cu-RR by a factor of 4, but increase the TaN-RR by a factor of about 20, so the Cu:TaN selectivity is degraded (at pH 5).

Using the same composition and adjusting the pH to 7 with 20 g of 50% hydroxylamine per 600 grams slurry for a total hydroxylamine concentration of about 1.7%, resulted in a very high Cu-RR of about 7100 to about 7300 Å/minute. In one o two tests the wafer appeared to be scratched.

Example 8

This example used a polishing solution with a pH of 2.2, which comprised about 5 wt. % 3-nitrobenzene sulfonic acid, sodium salt; about 5 wt. % alumina (available commercially as EKC-9001 from EKC Technology, Hayward, Calif.), about 1 wt. % gallic acid; and about 89 wt. % deionized water. Under process conditions of 4/0/90/90/60 with a POLITEX pad, the Cu-RR was 564 Å/minute.

A solution similar in composition but with a pH of 6 (adjusted with 20 g of 50% HDA per 1600 grams slurry to give 0.625% by weight hydroxylamine), under process conditions of 4/0/90/90/60 with a POLITEX pad, the Cu-RR was 4950 Å/min with only 5.1% nonuniformity, the TaN-RR was 1200 to 1530 Å/min, and the TEOS-RR was 690 Å/minute. This composition provided very high rates, a clean good surface with an average roughness of only 3.7 Å, and acceptable Cu:TEOS selectivity of 7 and a Cu:TaN selectivity of 3.2 to 4.1. Increasing the pressure to give a process of 2/0/90/90/175 gave a Cu-RR of 5620 Å/minute, with an excellent non-uniformity. Additionally, after the slurry was allowed to age for 2 days, the Cu-RR at the same conditions was 5380 Å/minute, showing very little degradation in performance over the fresh slurry. There was no change in the measured pH, which remained at 6 during this aging process.

Example 9

This test used a lower concentration of the organosulfonic acid compound. This example used a polishing solution with a pH of 6, which comprised about 1 wt. % 3-nitrobenzene sulfonic acid, sodium salt; about 5 wt. % alumina (available commercially as EKC-9001 from EKC Technology, Hayward, Calif.), about 1 wt. % gallic acid; about 0.86% hydroxylamine; and about 88 wt. % deionized water. Under process conditions of 2/0/90/90/175 with a IC-1000 pad, the Cu-RR was 5270 Å/minute. Under process conditions of 2/0/90/90/175 with a IC-1000 pad, the Cu-RR was 3390 Å/minute, the TaN-RR was 940 Å/minute, and the TEOS-RR was 340 Å/minute. The surface gave an average roughness of 6.4 Å.

Example 10

This test evaluated this same composition which had about 1 wt. % 3-nitrobenzene sulfonic acid, sodium salt; about 5 wt. % alumina (available commercially as EKC-9001 from EKC Technology, Hayward, Calif.), about 1 wt. % gallic acid; about 0.86% hydroxylamine; and about 88 wt. % deionized water, at various process conditions. The tests were done on a SEMATECH 854 wafer having PE-TEOS, silicon nitride, thermal oxide, Ta, and Cu.

At conditions of 2/0/50/60/01 for 10 seconds, the Cu-RR was 6250 Å/minute.

At conditions of 2/0/50/50/01 for 10 seconds, the Cu-RR was 4800 Å/minute, with evidence of Ta overpolishing in the center. Minor line dishing was 708 angstroms in the center, 804 angstroms in the middle, and 1100 angstroms on the edge.

At conditions of 2/0/50/60/01 for 5 seconds, the Cu-RR was 5280 Å/minute.

Example 11

This example demonstrates that a CMP solution that includes Metanilic acid (3-Amino-benzenesulfonic acid) as the organosulfonic oxidizing agent has been successfully applied to the removal of (1,0,0) crystalline silicon. Application of about 5 weight % colloidal alumina and about 0.5 molar (about 10% by weight of the fluid composition) of Metanilic acid removed crystalline silicon at a rate as high as about 500 nm/minute (5000 Å/minute) using an electrochemical (oxidative) CMP process.

Example 12

Polishing experiments using an electrochemical CMP tool were conducted using a CMP solution with varying amounts of Metanilic acid and abrasive to determine the uniformity of removal of material from a 3 inch wafer. Measurements were made after polishing using an ellipsometer at points separated by 5 mm on lines 2 mm below and 2 mm above center on a 3 inch wafer.

Polishing polysilicon with a formulation having 2% Metanilic acid and 3.4% alumina-coated silica at pH 4.6 for 100 seconds gave a uniform thickness within a few Angstroms thickness at all positions. Polishing polysilicon with a formulation having 2% Metanilic acid and 3.4% alumina-coated silica at pH 2.5 for 100 seconds gave a thickness of between about 5 and about 10 Angstroms thicker than the thickness at the outer edge of the wafer. Polishing polysilicon with a formulation having 1% Metanilic acid and 1.7% alumina-coated silica at pH 2.5 for 50 seconds gave a thickness of between about 6 and 9 Angstroms thinner than the thickness at the outer edge of the wafer. Polishing polysilicon with a formulation having 1% Metanilic acid and 1.7% alumina-coated silica at pH 2.5 for 50 seconds gave a thickness varying between about 5 Angstroms thicker to about 21 Angstroms thinner than the thickness at the outer edge of the wafer. Polishing polysilicon with a formulation having 1% Metanilic acid and 1.7% alumina-coated silica at pH 3.5 for 100 seconds gave a thickness varying by 21 Angstroms only at one point of measure from the thickness at the outer edge of the wafer.

Example 13

Polishing experiments using an electrochemical CMP tool were conducted using a CMP solution having a pH of about 5.5 and with 1% metanilic acid and varying amounts of abrasive to determine the uniformity of removal of material from a 3 inch wafer. Using a formulation containing about 1%, about 2%, about 3%, and about 5% of alumina-coated silica yielded polysilicon removal rates of about 850, about 1130, about 1350, and about 2270 Angstroms per minute, respectively.

It was also noted that these removal rates were independent of pH. Using a formulation containing 1% metanilic acid and about 1% abrasive, it was found that the removal rates were uniform from about pH 3 to about pH 7, with slightly increased values at lower and higher pH (e.g., up to about 1130 Angstroms per minute at pH 7.5 and up to about 1350–1360 Angstroms per minute at pH 1.5 and 8.5).

Example 14

The effect of pH on polysilicon removal rates was investigated. Polishing polysilicon with a formulation having 1% Metanilic acid and 1.7% alumina-coated silica at pH 1.5 gave a removal rate of 140 nm per minute; at pH 2.5 for 50 seconds gave a removal rate of 338 nm per minute; at pH 3.5 for 100 seconds gave a polishing rate of 83 nm/minute; at pH 4.5 for 100 seconds gave a polishing rate of 84 nm/minute; at pH 5.5 for 100 seconds gave a polishing rate of 85 nm/minute, and duplicate tests for 200 seconds gave a polishing rate of 85 nm/minute; at pH 7.5 for 100 seconds gave a polishing rate of 113 nm/minute; at pH 7.5 for 100 seconds gave a polishing rate of 136 nm/minute; and at pH 9.5 for 100 seconds gave a polishing rate of 135 nm/minute. There is a broad pH window in which the composition is effective. It is not understood why the removal rate at pH 2.5 was so high.

Example 15

The effect of abrasive concentration was investigated. Polishing polysilicon with a formulation having 1% Metanilic acid and 1.7% alumina-coated silica at pH 5.5 gave a removal rate of 85 nm per minute. Polishing polysilicon with a formulation having 1% Metanilic acid and 3.4% alumina-coated silica at pH 5.5 gave a removal rate of 113 nm per minute. Polishing polysilicon with a formulation having 1% Metanilic acid and 5.1% alumina-coated silica at pH 5.5 gave a removal rate of 135 nm per minute. Polishing polysilicon with a formulation having 1% Metanilic acid and 8.5% alumina-coated silica at pH 5.5 gave a removal rate of 227 nm per minute. It can be seen that increasing the abrasive content in the presence of the organosulfonic oxidizer Metanilic acid increases the polishing rate, and the effect seems to increase as the abrasive loading increases.

Comparative examples were run with no Metanilic acid but with 1.7% and 5.1% alumina-coated silica at pH 5.5, and removal rates without the organosulfonic oxidizer Metanilic acid ranged from 68 to 71 nm/minute. There is much less effect on removal rate with abrasive content in the absence of the organosulfonic oxidizer Metanilic acid.

Example 16

The effect of pH was investigated. Polishing polysilicon with a formulation having 1.9% Metanilic acid, 25.4% of a 20% solution of colloidal alumina-coated silica, and sufficient TMAH to give a pH 4.8 and a pH 9 each gave a removal rate of about 1000 Angstroms per minute on 8 inch wafers. It is noted here that, although alumina-coated silica was used, any abrasive having a hardness greater than or approximately equal to that of silica should give comparable results.

What is claimed is:

1. A method of chemically mechanically polishing a substrate surface comprising:
    A) providing a substrate, said substrate being a semiconductor material or memory device material and having a surface comprising at least one material comprising copper, iron, nickel, tungsten, titanium, aluminum, polysilicon, or noble metals;
    B) providing a fluid polishing composition comprising an organosulfonic acid oxidizer, said organosulfonic acid oxidizer having one ring structure comprising carbon, a sulfonate moiety substituted onto a carbon atom in the ring structure, and a polar moiety substituted onto the ring on an ortho position or a meta position from the sulfonate moiety; wherein said polar moiety substituted onto the ring in the ortho or meta position from the sulfonate moiety comprises a sulfonate moiety, a sulfate moiety, a nitro moiety, a nitroso moiety, a hydroxyl moiety, a carboxylate moiety, a sulfamic acid moiety, or a methoxy moiety, C) providing a pad; and D) moving the pad against the substrate with the polishing composition therebetween to effect chemical mechanical polishing of at least one material comprising copper, iron, nickel, tungsten, titanium, aluminum, polysilicon, or noble metals.

2. The method of claim 1, wherein the organosulfonic acid oxidizer has an electrochemical oxidation potential greater than 0.7 V, the ring structure is a benzene ring, and the sulfonate moiety attached directly to the ring structure.

3. The method of claim 1, wherein the polar moiety is substituted directly onto the ring, and wherein the polishing composition further comprises an abrasive.

4. The method of claim 1, wherein the polar moiety is selected from a sulfonate moiety, and a nitro moiety, substituted directly onto the ring in a meta position, and wherein the polishing composition further comprises an abrasive.

5. The method of claim 1, wherein the amount of organosulfonic acid oxidizer is between about 0.1% to about 20% by weight, and the amount of abrasive is between about 1% to about 15% by weight, based on the weight of the fluid composition.

6. The method of claim 1, wherein the polishing composition is substantially free of additional oxidizers.

7. The method of claim 1, wherein the organosulfonic acid oxidizer has an electrochemical oxidation potential greater than 0.7 V, the ring structure comprises a plurality of carbon atoms and at least one of N, S, or O, and the sulfonate moiety attached directly to the ring structure.

8. The method of claim 1, wherein the polishing composition is substantially free of additional oxidizers.

9. The method of claim 1, wherein said organosulfonic acid oxidizer is 3-nitrobenzene sulfonic acid.

10. The method of claim 1, wherein the polishing composition further comprises an abrasive and a hydroxylamine compound.

11. The method of claim 10, wherein the amount of organosulfonic acid oxidizer is between about 0.1% to about 20% by weight, the amount of abrasive is between about 1% to about 15% by weight, and the amount of hydroxylamine compound is between about 0.1% to about 5% by weight, based on the weight of the fluid composition.

12. A method of chemically mechanically polishing a substrate surface comprising:

A) providing a substrate, said substrate being a semiconductor material or memory device material and having a surface comprising at least one material comprising copper, iron, nickel, tungsten, titanium, aluminum, polysilicon, or noble metals;

B) providing a fluid polishing composition consisting essentially of:

at least one organosulfonic acid oxidizer, said organosulfonic acid oxidizer having a ring structure comprising carbon, a sulfonate moiety substituted onto a carbon atom in the ring structure, and a polar moiety substituted onto the ring on an ortho position or a meta position from the sulfonate moiety, wherein said polar moiety substituted onto the ring in the ortho or meta position from the sulfonate moiety comprises a sulfonate moiety, a sulfate moiety, a nitro moiety, a nitroso moiety, a hydroxyl moiety, a carboxylate moiety, a sulfamic acid moiety, or a methoxy moiety, water, optionally at least one hydroxylamine compound, optionally at least one abrasive, and optionally at least one additive selected from the group consisting of Acids, Bases, Chelators, Corrosion Inhibitors, Surfactants, Rheological agents, and combinations thereof;

C) providing a pad; and

D) moving the pad against the substrate with the polishing composition therebetween to effect chemical mechanical polishing of at least one material comprising copper, iron, nickel, tungsten, titanium, aluminum, polysilicon, or noble metals.

13. The method of claim 12, wherein the polishing composition is substantially free of additional oxidizers.

14. The method of claim 12, wherein said organosulfonic acid oxidizer is 3-nitrobenzene sulfonic acid.

15. A method of cleaning a substrate surface comprising:

A) providing a substrate, said substrate being a semiconductor material or memory device material and having a surface comprising at least one material comprising copper, iron, nickel, tungsten, titanium, aluminum, polysilicon, or noble metals, and further comprising residue from contacting a chemical mechanical polishing composition in a previous step;

B) providing a fluid cleaning composition comprising an organosulfonic acid oxidizer, said organosulfonic acid oxidizer having a ring structure comprising carbon, a sulfonate moiety substituted onto a carbon atom in the ring structure, and a polar moiety substituted onto the ring on an ortho position or a meta position from the sulfonate moiety;

C) contacting the substrate with the cleaning composition at a temperature and for a time sufficient to remove the chemical mechanical polishing residue from a previous step.

16. A method of cleaning a substrate surface comprising:

A) providing a substrate, said substrate being a semiconductor material or memory device material and having a surface comprising at least one material comprising copper, iron, nickel, tungsten, titanium, aluminum, polysilicon, or noble metals, and further comprising post-etch residue from etching the substrate in a previous step;

B) providing a fluid cleaning composition comprising an organosulfonic acid oxidizer, said organosulfonic acid oxidizer having a ring structure comprising carbon, a sulfonate moiety substituted onto a carbon atom in the ring structure, and a polar moiety substituted onto the ring on an ortho position or a meta position from the sulfonate moiety;

C) contacting the substrate with the cleaning composition at a temperature and for a time sufficient to remove the post-etch residue.

17. A method of cleaning a substrate surface comprising:

A) providing a substrate, said substrate being a semiconductor material or memory device material and having a surface comprising at least one material comprising copper, iron, nickel, tungsten, titanium, aluminum, polysilicon, or noble metals, and further comprising a resist from a previous step;

B) providing a fluid cleaning composition comprising an organosulfonic acid oxidizer, said organosulfonic acid oxidizer having a ring structure comprising carbon, a sulfonate moiety substituted onto a carbon atom in the ring structure, and a polar moiety substituted onto the ring on an ortho position or a meta position from the sulfonate moiety;

C) contacting the substrate with the cleaning composition at a temperature and for a time sufficient to remove the resist.

18. A method of chemically mechanically polishing a substrate surface comprising:
A) providing a substrate, said substrate being a semiconductor material or memory device material and having a surface comprising at least one material comprising copper, iron, nickel, tungsten, titanium, aluminum, polysilicon, or noble metals;
B) providing a fluid polishing composition comprising an organosulfonic acid oxidizer, said organosulfonic acid oxidizer having one ring structure comprising carbon, a sulfonate moiety substituted onto a carbon atom in the ring structure, wherein said organosulfonic acid oxidizer is 3-amino benzenesulfonic acid;
C) providing a pad; and
D) moving the pad against the substrate with the polishing composition therebetween to effect chemical mechanical polishing of at least one material comprising copper, iron, nickel, tungsten, titanium, aluminum, polysilicon, or noble metals.

* * * * *